United States Patent
Chen et al.

[19]

[11] Patent Number: 5,923,973
[45] Date of Patent: Jul. 13, 1999

[54] METHOD OF MAKING GREEK LETTER PSI SHAPED CAPACITOR FOR DRAM CIRCUITS

[75] Inventors: Li Yeat Chen; Ing-Ruey Liaw, both of Hsinchu, Taiwan

[73] Assignee: Vanguard International Semiconductor Corporation, Hsin-Chu, Taiwan

[21] Appl. No.: 08/957,674

[22] Filed: Oct. 24, 1997

[51] Int. Cl.⁶ .................................................. H01L 21/8242
[52] U.S. Cl. ............................................ 438/255; 438/675
[58] Field of Search ..................................... 438/253, 255, 438/396, 398, 665, 675, 964

[56] References Cited

U.S. PATENT DOCUMENTS

| | | | |
|---|---|---|---|
| 5,174,858 | 12/1992 | Yamamoto et al. | 438/675 |
| 5,389,568 | 2/1995 | Yan | 437/60 |
| 5,492,850 | 2/1996 | Ryou | 438/253 |
| 5,550,076 | 8/1996 | Chen | 438/253 |
| 5,554,557 | 9/1996 | Roh | 437/52 |
| 5,571,742 | 11/1996 | Jeong | 437/52 |
| 5,817,554 | 10/1998 | Tseng | 438/255 |

*Primary Examiner*—Chandra Chaudhari
*Attorney, Agent, or Firm*—George O. Saile; Stephen B. Ackerman; Larry J. Prescott

[57] ABSTRACT

A method of forming a capacitor having a cross section shape similar to the Greek letter psi. The shape of the capacitor plate provides a high capacitance using a modest amount of chip area. A capacitor hole is etched in a thick layer of a first dielectric. A layer of polysilicon is formed on the dielectric layer covering the sidewalls and bottom of the capacitor hole. A second dielectric is then used to fill the hole. A contact hole in the second dielectric extends to the contact region of the wafer and is filled with a polysilicon plug. The polysilicon plug and the polysilicon covering the sidewalls and bottom of the capacitor hole form the first capacitor plate. A layer of hemispherical grain polysilicon can be used to further increase the surface area of the first capacitor plate.

20 Claims, 8 Drawing Sheets

METHOD OF MAKING GREEK LETTER PSI SHAPED CAPACITOR FOR DRAM CIRCUITS

BACKGROUND OF THE INVENTION (1) Field of the Invention

This invention relates to a method of forming a capacitor plate having a cross section shape similar to the Greek letter psi. The shape of the plate provides expanded surface area and increased capacitance. Hemispherical grain polysilicon is also used to increase the surface area.

(2) Description of the Related Art

U.S. Pat. No. 5,389,568 to Yun describes a DRAM capacitor having a capacitor plate with a peripheral wall and a center post with a hole in the center of the center post. The peripheral wall and center post with a hole in the center provide increased surface area for the capacitor plate.

U.S. Pat. No. 5,571,742 to Jeong describes a DRAM capacitor using interconnected stacked capacitor plates to provide increased surface area for the capacitor.

U.S. Pat. No. 5,554,557 to Koh describes a method of forming capacitors using polysilicon sidewall spacers, or fences, to form the capacitor storage electrode.

Patent Application VIS-86-030, Ser. No. 08/949,469, entitled "A METHOD OF FABRICATING A CAPACITOR STORAGE NODE HAVING A RUGGED-FIN SURFACE," filed, Oct. 14, 1997, and now U.S. Pat. No. 5,759,895, assigned to the same assignee describes a method of forming a capacitor from an amorphous silicon plate attached to a polysilicon stud. The polysilicon stud keeps the capacitor plate above the integrated circuit wafer. A low pressure annealing step is used to roughen the surface of the amorphous silicon plate thereby increasing its surface area.

This invention describes a method of forming a capacitor plate having a cross sectional shape similar to the Greek letter psi. Hemispherical grain polysilicon is also used on the surface of the capacitor plate to further increase the surface area.

SUMMARY OF THE INVENTION

Capacitors having sufficient storage capacity are important in integrated circuit applications, particularly in the application of dynamic random access memory, DRAM, applications. With limited real estate available on the integrated circuit chip for each DRAM circuit, particularly as ship sizes become smaller and smaller, finding space for a capacitor with sufficient capacitance becomes increasingly difficult.

It is a principle objective of this invention to provide methods of forming a capacitor storage node having a large surface area while using a small part of the chip surface area.

These objectives are achieved using a capacitor storage node which, in cross section, is shaped like the Greek letter psi. An integrated circuit wafer has devices and a layer of first dielectric. A layer of second dielectric is deposited over the layer of first dielectric. A thick layer of third dielectric is deposited over the layer of second dielectric. A capacitor hole, having sidewalls and a bottom, is then etched in the thick layer of third dielectric. A layer of polysilicon is then deposited on the thick layer of third dielectric, after the capacitor holes have been etched, covering the sidewalls and the bottom. In one embodiment of the invention the layer of polysilicon is covered by a layer of hemispherical grain polysilicon at this point.

The capacitor holes with the polysilicon on the sidewalls and the bottom are then filled with a fourth dielectric and a via hole is etched to expose a contact region on the integrated circuit wafer. The via hole is then filled with polysilicon. The polysilicon above the top surface of the thick layer of third dielectric is then etched away. The remaining third dielectric and fourth dielectric are then etched away leaving a first capacitor plate which, in cross section, is shaped like the Greek letter psi. A conformal layer of fifth dielectric and a layer of polysilicon are then deposited on the first capacitor plate and patterned to complete the capacitor.

DESCRIPTION OF THE PREFERRED EMBODIMENTS

Figure 1:
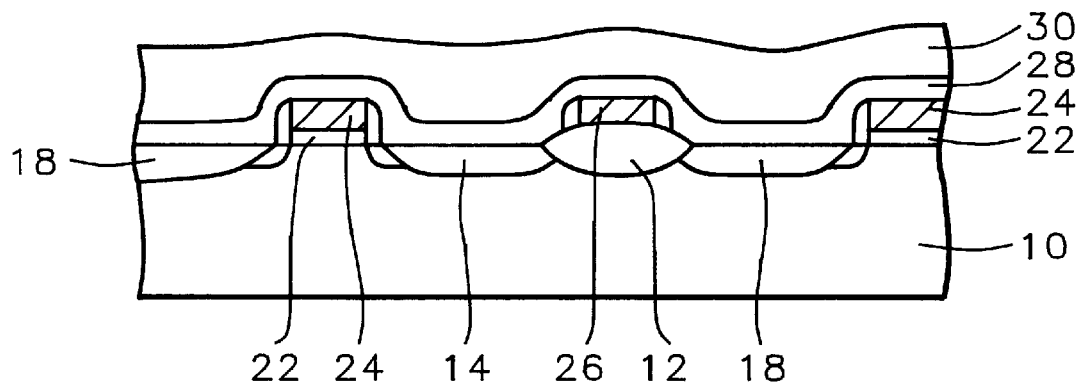
FIG. 1 is a cross section of an integrated circuit wafer showing devices, electrodes, a base oxide layer and the first dielectric layer.

Refer now to FIGS. 1–12 for a description of a preferred embodiment of a method of forming the psi shaped capacitor of this invention. FIG. 1 shows a cross section view of a part of an integrated circuit wafer 10. The integrated circuit wafer 10 contains drain regions 18, a source 14, a field oxide isolation region 12, a gate oxide 22, and a polysilicon gate electrode 24. The wafer 10 has a contact region which will be electrically connected to one plate of the capacitor and in this example the contact region is in the source region 14. The devices shown are part of a dynamic random access memory circuit, DRAM, and includes a polysilicon word line electrode 26 formed on the field oxide region 12. Although the example shown here is a DRAM circuit and high capacitance capacitors have particular value in the DRAM application, those skilled in the art will recognize that the method and capacitor of this invention can have application in many different circuits. A base layer of undoped oxide 28, such as silicon dioxide having a thickness of between about 1500 and 2500 Angstroms, is deposited on the wafer.

Figure 2:
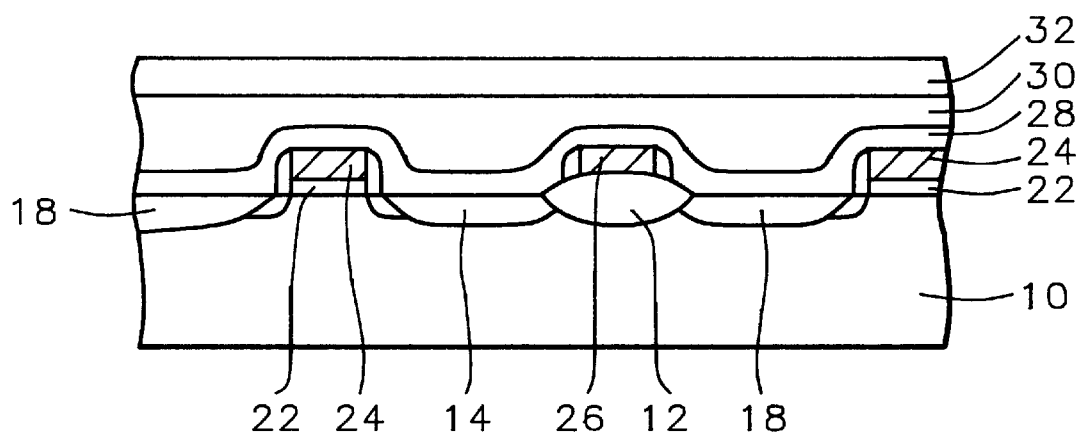
FIG. 2 is a cross section view of the integrated circuit wafer of FIG. 1 showing the second dielectric layer.
Figure 3:
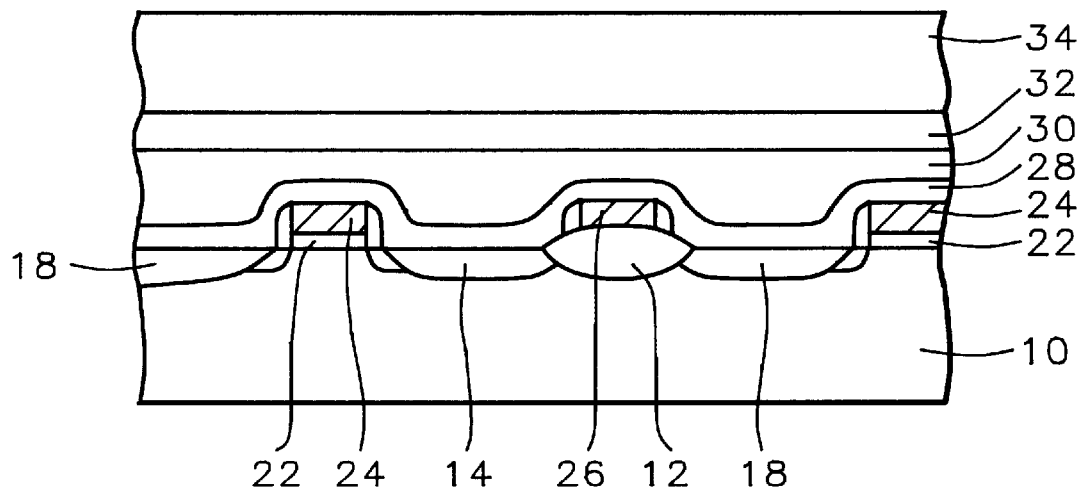
FIG. 3 is a cross section view of the integrated circuit wafer of FIG. 2 showing the third dielectric layer.

A layer of first dielectric 30, such as borophosphosilicate glass having a thickness of between about 3000 and 4500 Angstroms or silicon oxide deposited using chemical vapor deposition of ozone and tetra-ethyl-ortho-silicate having a thickness of between about 3000 and 4500 Angstroms, is then deposited over the base layer of undoped oxide 28. As shown in FIG. 2 the layer of first dielectric 30 is then planarized using a method such as chemical mechanical polishing or dry etching. A layer of second dielectric 32, such as silicon oxynitride or silicon nitride, $Si_xN_y$, having a thickness of between about 60 and 200 Angstroms is then deposited on the planarized layer of first dielectric 30. Next, as shown in FIG. 3, a thick layer of third dielectric 34, such as borophosphosilicate glass having a thickness of between about 9000 and 13,500 Angstroms or silicon oxide deposited using chemical vapor deposition of ozone and tetra-ethyl-ortho-silicate having a thickness of between about 9000 and 13,500 Angstroms, is then deposited over the layer of second dielectric 32.

Figure 4:
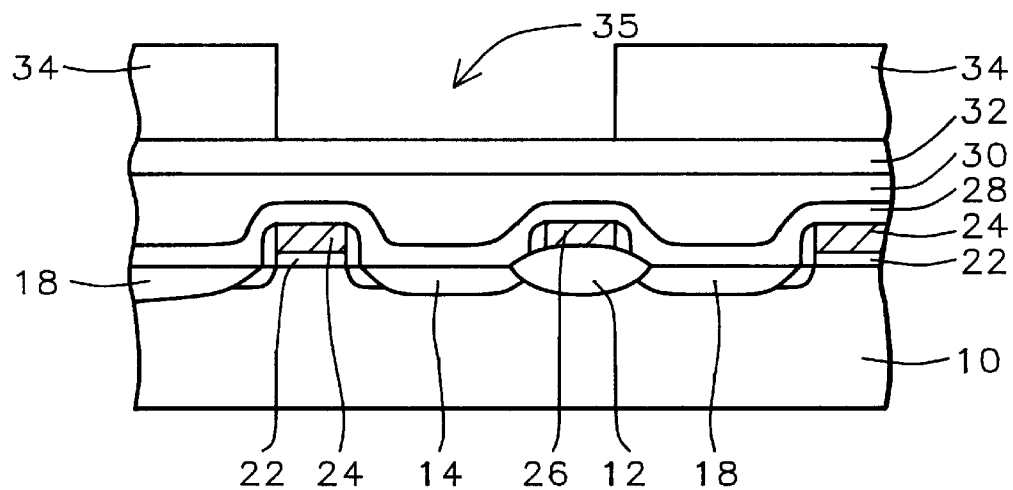
FIG. 4 is a cross section view of the integrated circuit wafer of FIG. 3 showing the capacitor holes etched in the third dielectric layer.
Figure 5:
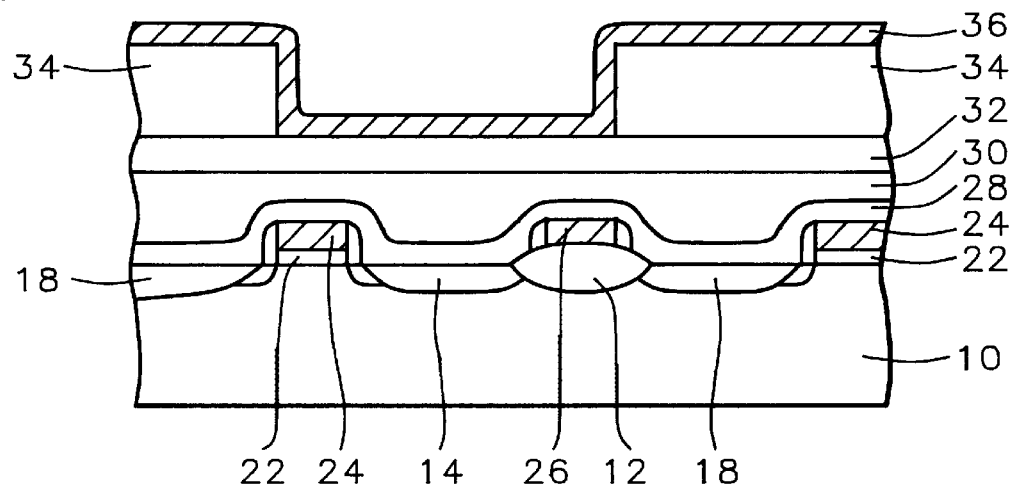
FIG. 5 is a cross section view of the integrated circuit wafer of FIG. 4 showing the layer of polysilicon formed on the wafer after the capacitor holes have been etched in the layer of third dielectric.

Next, as shown in FIG. 4, a capacitor hole 35 having sidewalls and a bottom is etched into the layer of third dielectric by means of standard photolithographic techniques and dry anisotropic etching using the silicon oxynitride or silicon nitride layer of second dielectric 32 as an etch stop. As can be seen in FIG. 4, the capacitor hole 35 is directly above the wafer region, in this example the source region 14, where electrical contact to the wafer will be made. As shown in FIG. 5, a layer first conductor material 36, in this example polysilicon having a thickness of between about 800 and 1000 Angstroms, is then deposited over the wafer covering the sidewalls and bottom of the capacitor hole.

Figure 6:
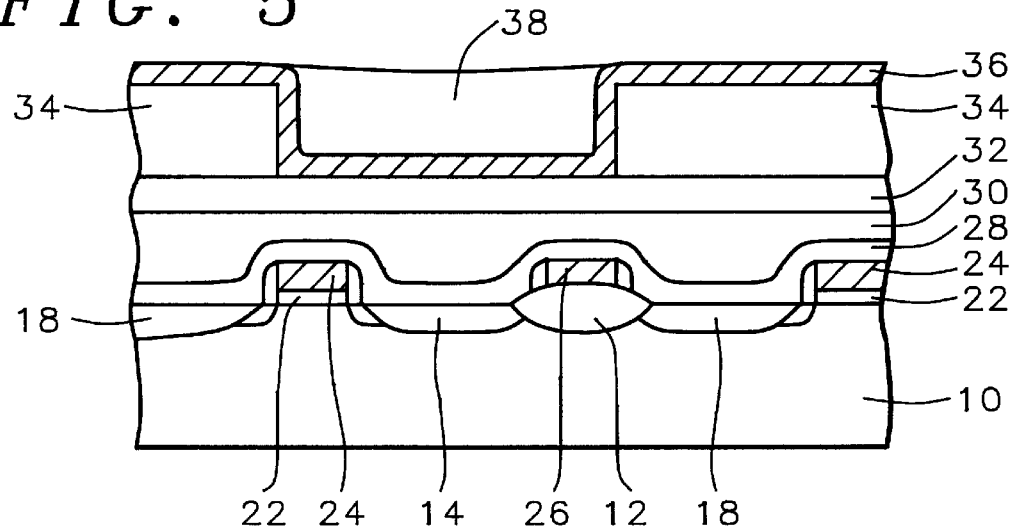
FIG. 6 is a cross section view of the integrated circuit wafer of FIG. 5 showing the fourth dielectric filling the capacitor holes.
Figure 7:
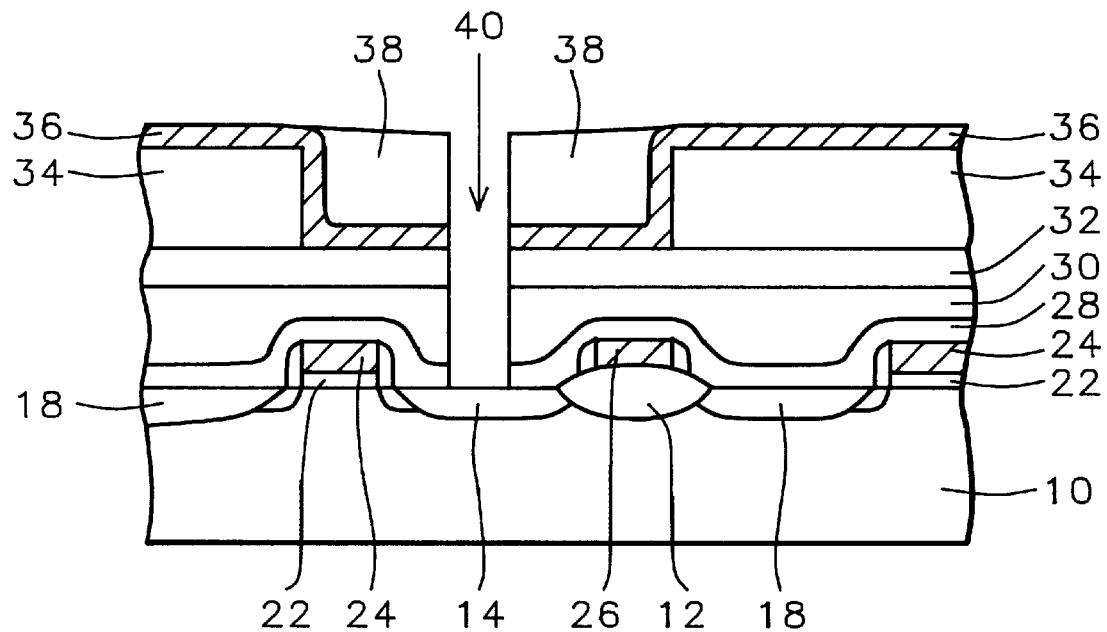
FIG. 7 is a cross section view of the integrated circuit wafer of FIG. 6 showing the contact hole etched to expose the contact region of the wafer.

Next, as shown in FIG. 6, a layer of fourth dielectric 38, such as borophosphosilicate glass, is then deposited on the wafer and etched back or planarized so that the fourth dielectric 38 fills the capacitor holes but is removed from other regions of the wafer. As shown in FIG. 7, a contact hole 40 is then etched in the fourth dielectric 38, the first conductor material 36, the second dielectric 32, the first dielectric 30, and the base oxide thereby exposing the contact region of the wafer, in this example the source 14, using standard photolithographic techniques and dry anisotropic etching.

Figure 8:
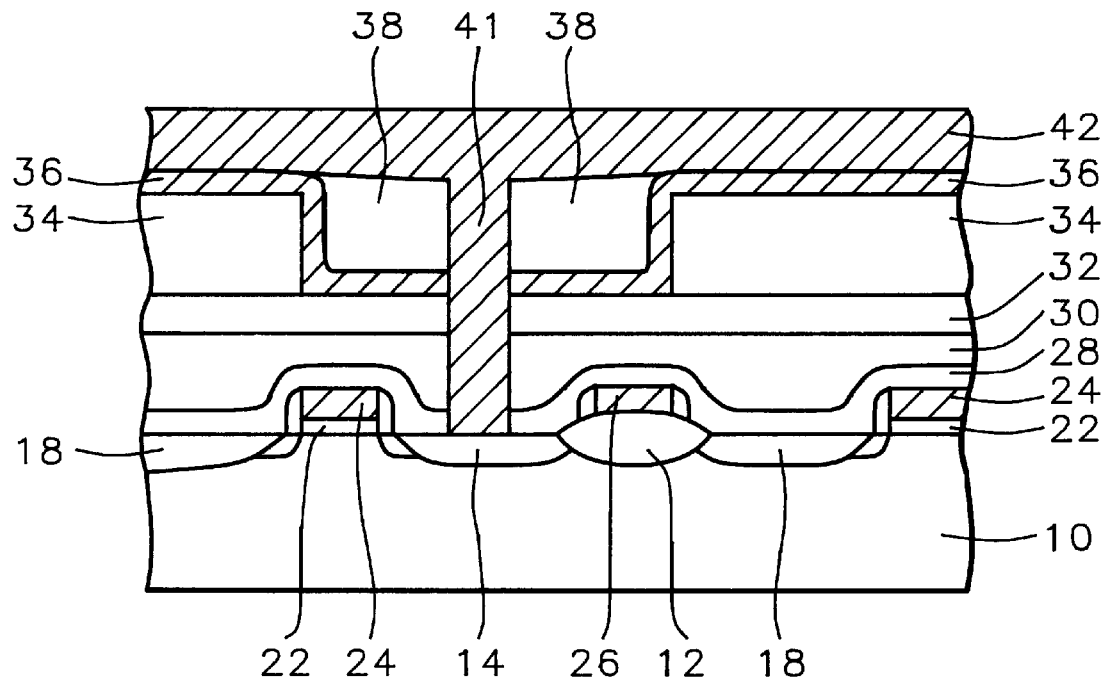
FIG. 8 is a cross section view of the integrated circuit wafer of FIG. 7 showing the polysilicon filling the contact hole.
Figure 9:
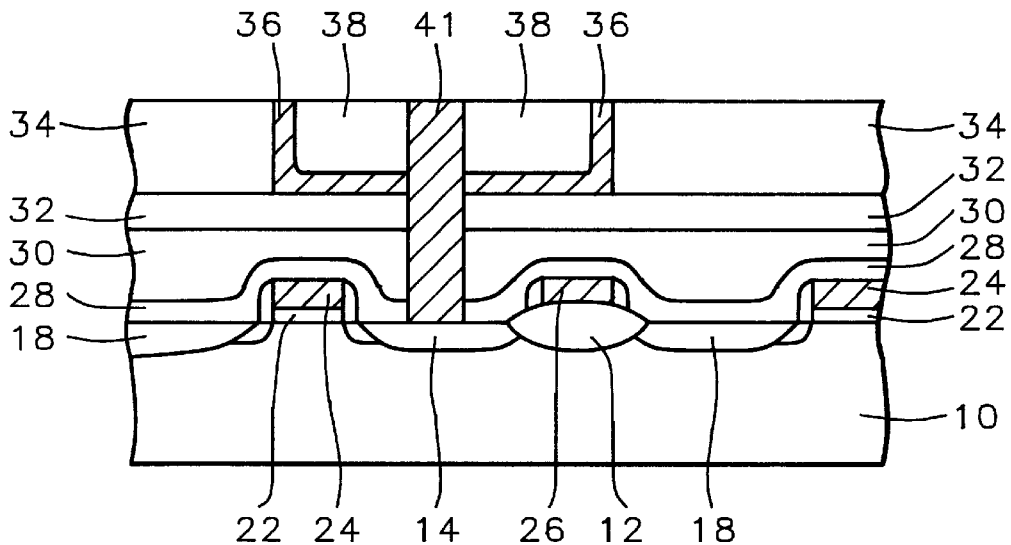
FIG. 9 is a cross section view of the integrated circuit wafer of FIG. 8 after the polysilicon above the top surface of the layer of third dielectric has been etched away.
Figure 10:
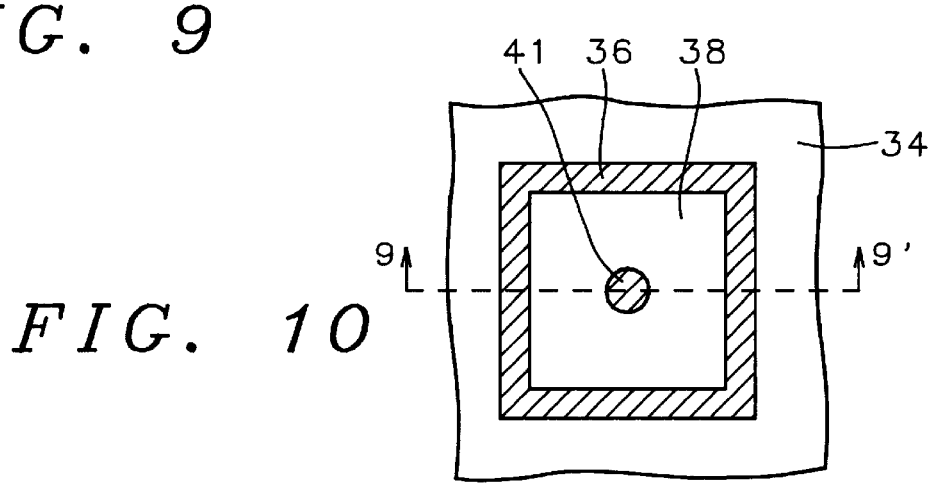
FIG. 10 is a top view of the wafer of FIG. 9.

A layer of second conductor material 42, in this example polysilicon, is then deposited on the wafer filling the contact hole with a plug 41 of second conductor material, see FIG. 8. The plug 41 of second conductor material, in this example polysilicon, makes electrical contact with the contact region of the wafer, in this example the source 14, and with the first conductor material 36, in this example also polysilicon. Next, as shown in FIG. 9, that part of the first conductor material 36, second conductor material 42, plug 41, and fourth dielectric 38 above the plane of the top surface of the layer of third dielectric 34 is removed using a means such as plasma etchback or chemical mechanical polishing. The remaining polysilicon first conductor material 36 and polysilicon plug 41 form the first capacitor plate which in cross section has the shape of the Greek letter psi, $\Psi$. The top view of the wafer at this stage is shown in FIG. 10 showing the polysilicon plug 41, the polysilicon first conductor material 36, the third dielectric 34 and the fourth dielectric 38. FIG. 9 is a cross section of that part of the wafer shown in FIG. 10 along line 9–9' of FIG. 10.

Figure 11:
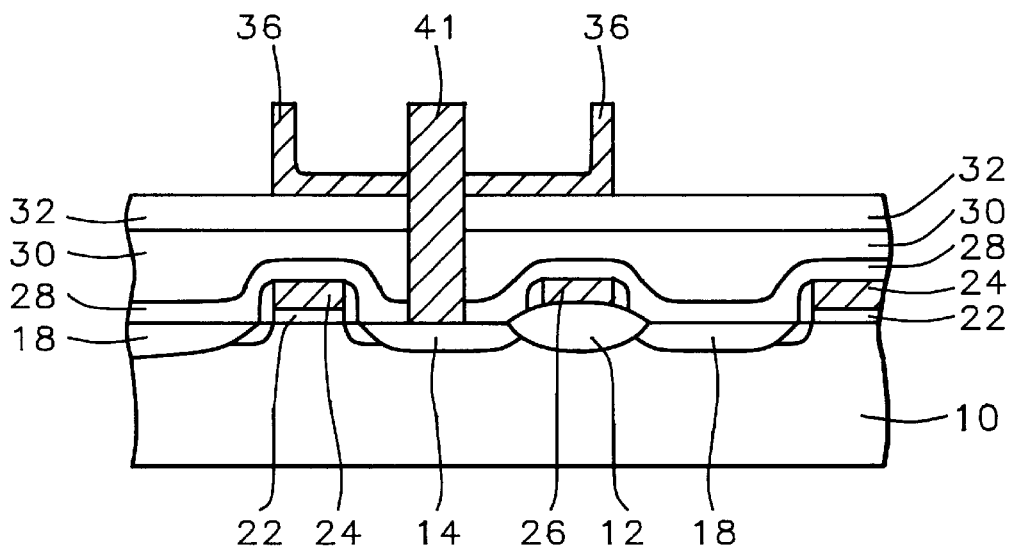
FIG. 11 is a cross section view of the integrated circuit wafer of FIG. 9 after the third dielectric and fourth dielectric have been etched away.
Figure 12:
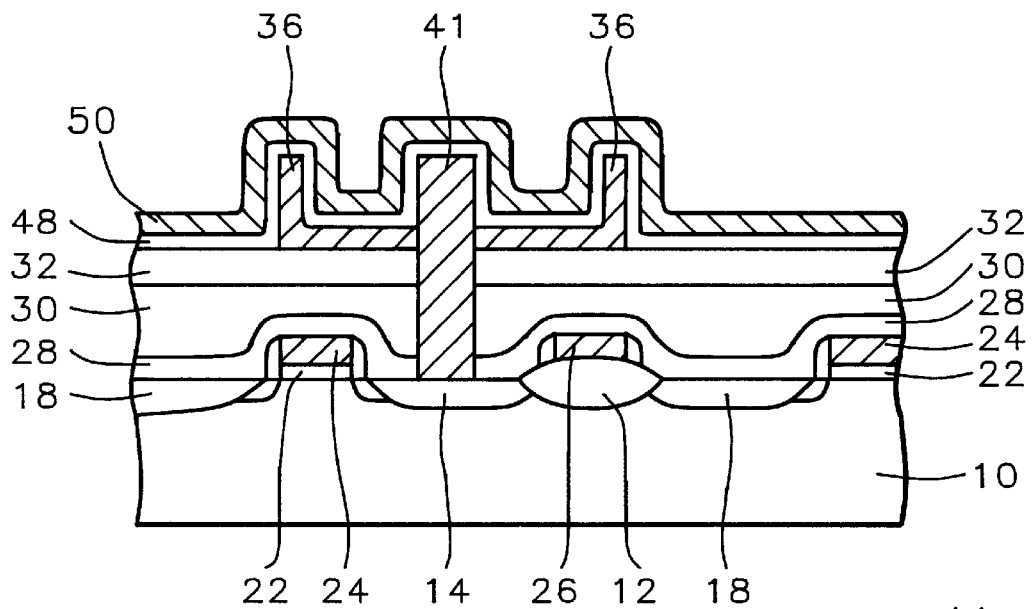
FIG. 12 is a cross section view of the integrated circuit wafer of FIG. 11 after the layer of fifth dielectric and polysilicon second capacitor plate have been deposited.

Next, as shown in FIG. 11, The remaining third dielectric and fourth dielectric are etched away completing the first capacitor plate, 46 and 41. As shown in FIG. 12, a conformal layer of fifth dielectric 48, such as NO, ONO, or $Ta_2O_5$ having a thickness of between about 55 and 300 Angstroms is then deposited covering the first capacitor plate. A layer of third conductor material 50, such as polysilicon, is then deposited over the conformal layer of fifth dielectric 48, see FIG. 12. The layer of fifth dielectric 48 and the layer of third conductor material 50 are then patterned to complete the capacitor.

Figure 13:
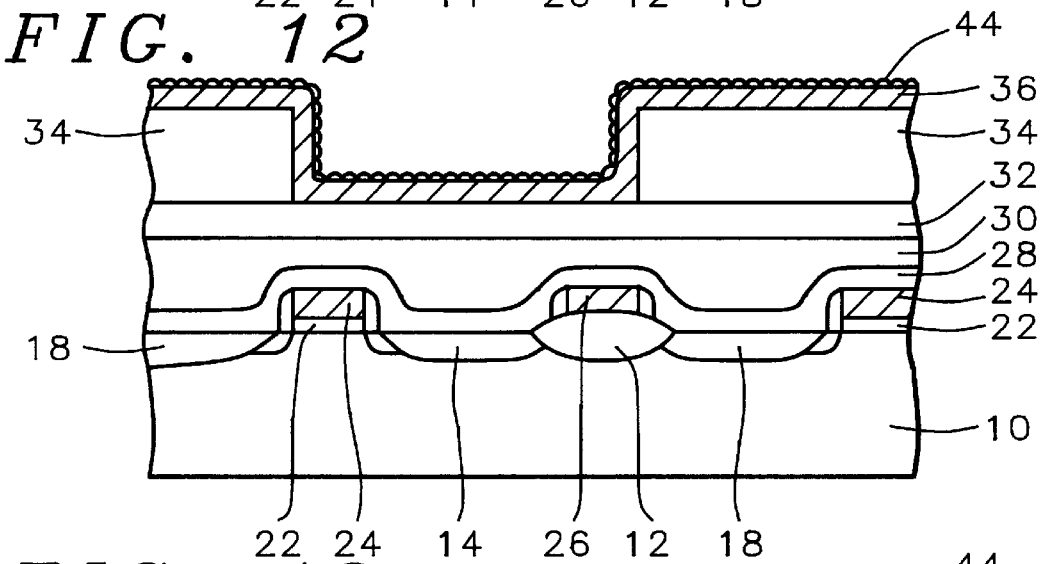
FIG. 13 is a cross section view of the integrated circuit wafer of FIG. 5 after the layer of hemispherical grain polysilicon has been deposited.

Refer now to FIGS. 1–5 and 13–20 for a second preferred embodiment of the capacitor and method of this invention. This embodiment proceed exactly like the preceding embodiment through the step of depositing a layer first conductor material 36, in this example polysilicon having a thickness of between about 800 and 1000 Angstroms, over the wafer covering the sidewalls and bottom of the capacitor hole, see FIGS. 1–5. Next, as shown in FIG. 13, a layer of hemispherical grain polysilicon 44 is deposited on the layer of first conductor material 36 by means of an as deposited site method or seeding method.

Figure 14:
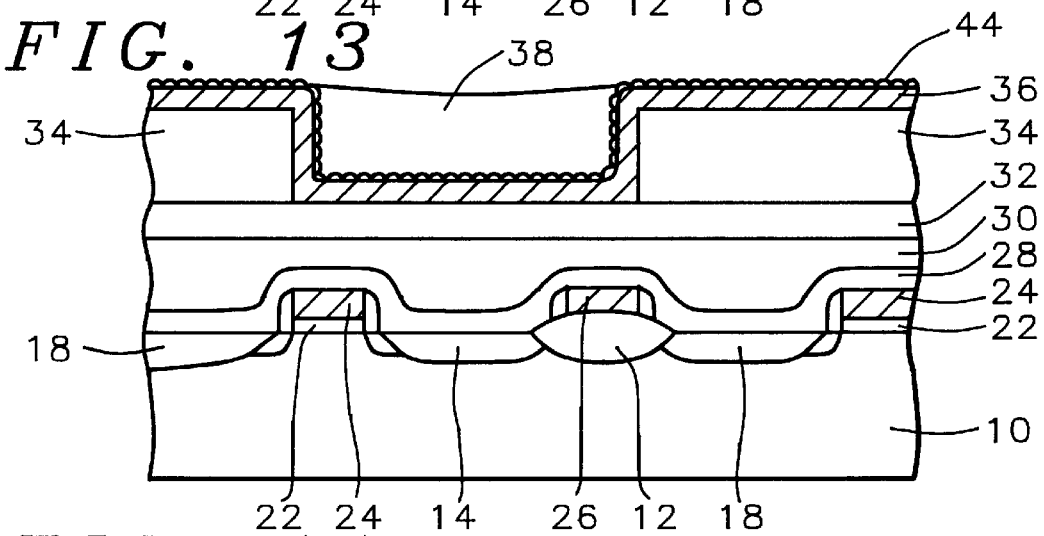
FIG. 14 is a cross section view of the integrated circuit wafer of FIG. 13 showing the fourth dielectric filling the capacitor holes.
Figure 15:
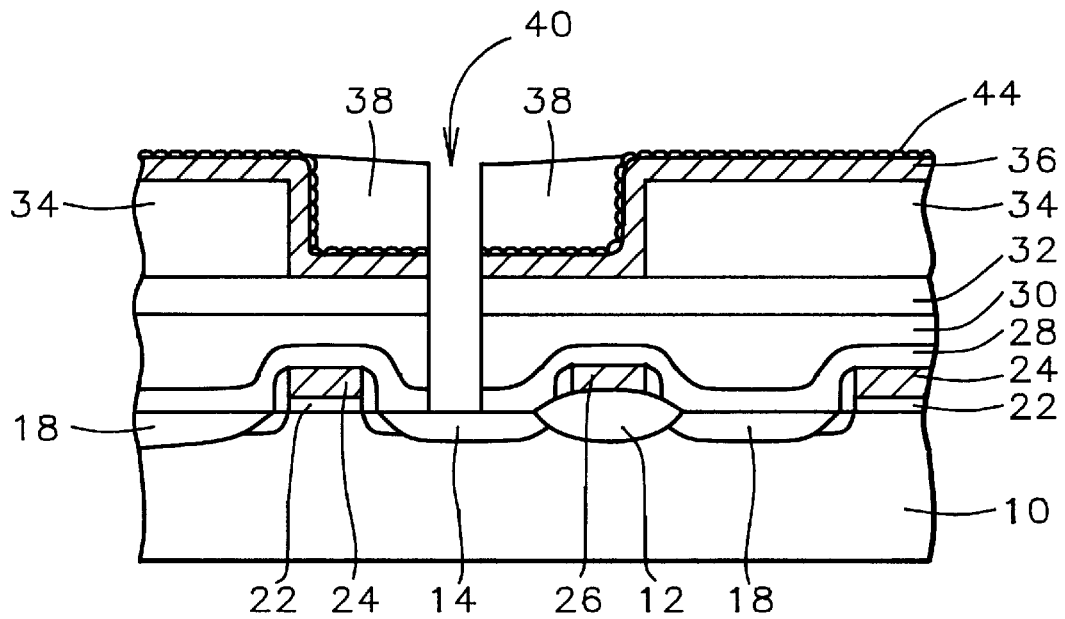
FIG. 15 is a cross section view of the integrated circuit wafer of FIG. 16 showing the contact hole etched to expose the contact region of the wafer.

Next, as shown in FIG. 14, a layer of fourth dielectric 38, such as borophosphosilicate glass, is then deposited on the wafer and etched back or planarized so that the fourth dielectric 38 fills the capacitor holes but is removed from other regions of the wafer. As shown in FIG. 15, a contact hole 40 is then etched in the fourth dielectric 38, the layer of hemispherical grain polysilicon 44, the first conductor material 36, the second dielectric 32, the first dielectric 30, and the base oxide thereby exposing the contact region of the wafer, in this example the source 14, using standard photolithographic techniques and dry anisotropic etching.

Figure 16:
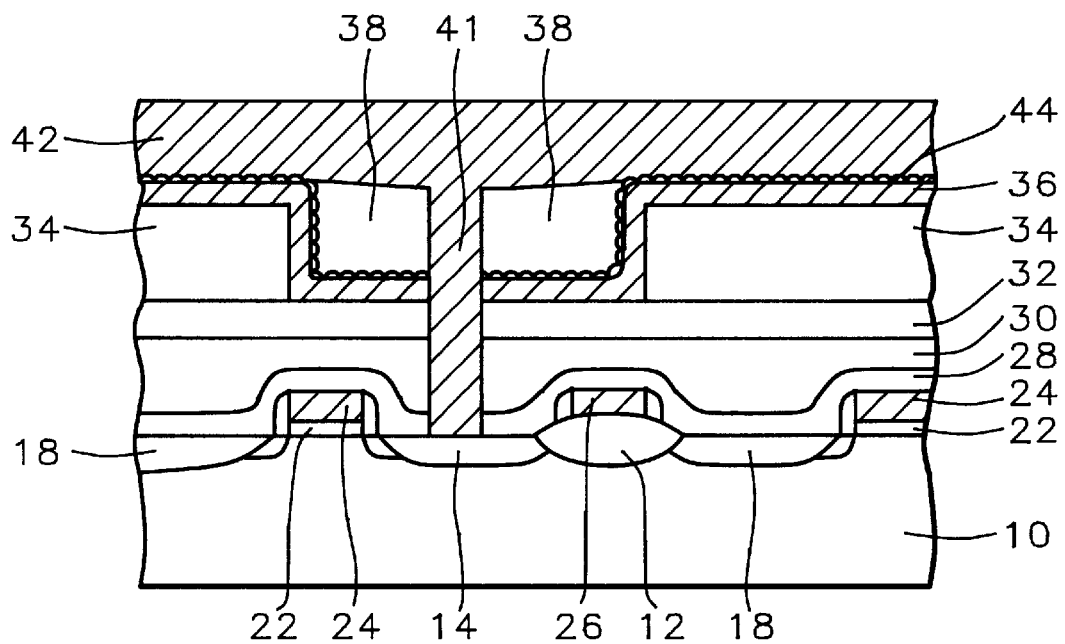
FIG. 16 is a cross section view of the integrated circuit wafer of FIG. 15 showing the polysilicon filling the contact hole.
Figure 17:
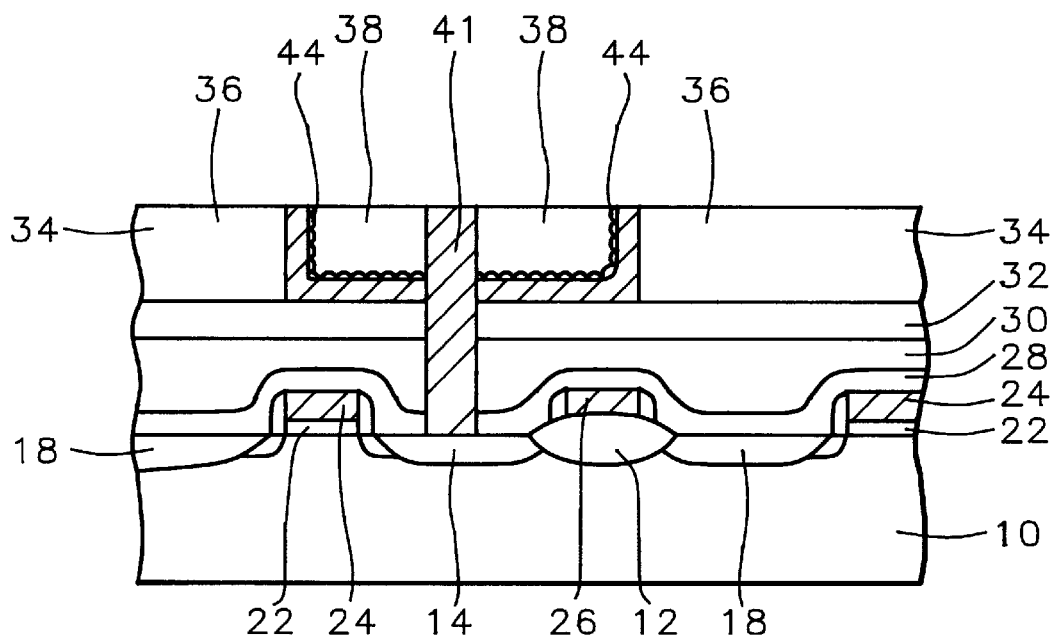
FIG. 17 is a cross section view of the integrated circuit wafer of FIG. 16 after the polysilicon above the top surface of the layer of third dielectric has been etched away.
Figure 18:
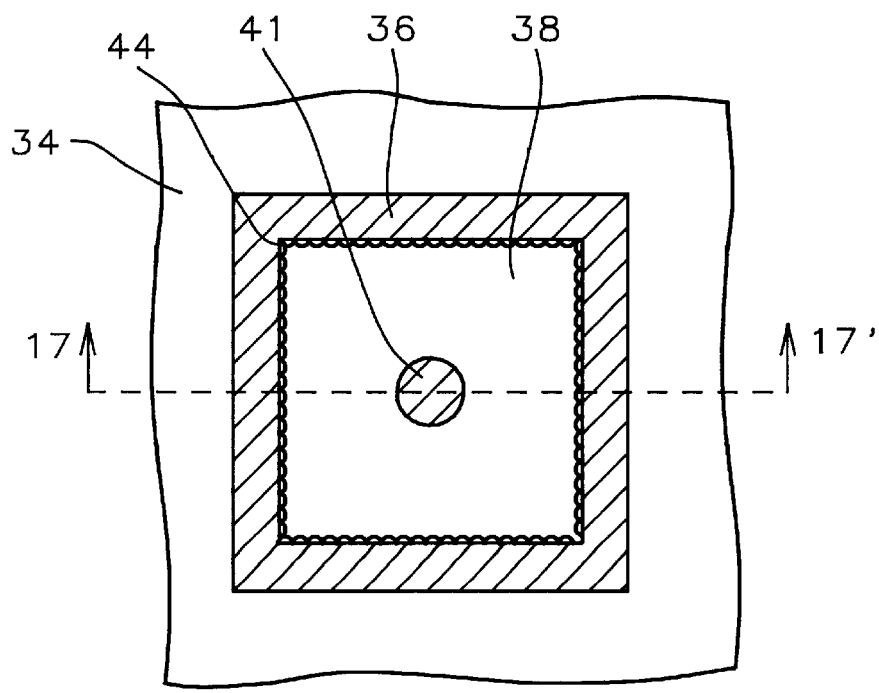
FIG. 18 is a top view of the wafer of FIG. 17.

A layer of second conductor material 42, in this example polysilicon, is then deposited on the wafer filling the contact hole with a plug 41 of second conductor material, see FIG. 16. The plug 41 of second conductor material, in this example polysilicon, makes electrical contact with the contact region of the wafer, in this example the source 14, with the layer of hemispherical grain polysilicon 44, and with the first conductor material 36, in this example also polysilicon. Next, as shown in FIG. 17, that part of the layer of hemispherical grain polysilicon 44, the layer of first conductor material 36, the second conductor material 42, plug 41, and fourth dielectric 38 above the plane of the top surface of the layer of third dielectric 34 is removed using a means such as plasma etchback or chemical mechanical polishing. The remaining polysilicon first conductor material 36, hemispherical grain polysilicon 44, and polysilicon plug 41 form the first capacitor plate which in cross section has the shape of the Greek letter psi, Ψ. The top view of the wafer at this stage is shown in FIG. 18 showing the polysilicon plug 41, the hemispherical grain polysilicon 44, the polysilicon first conductor material 36, the third dielectric 34 and the fourth dielectric 38. FIG. 17 is a cross section of that part of the wafer shown in FIG. 18 along line 17–17' of FIG. 18.

Figure 19:
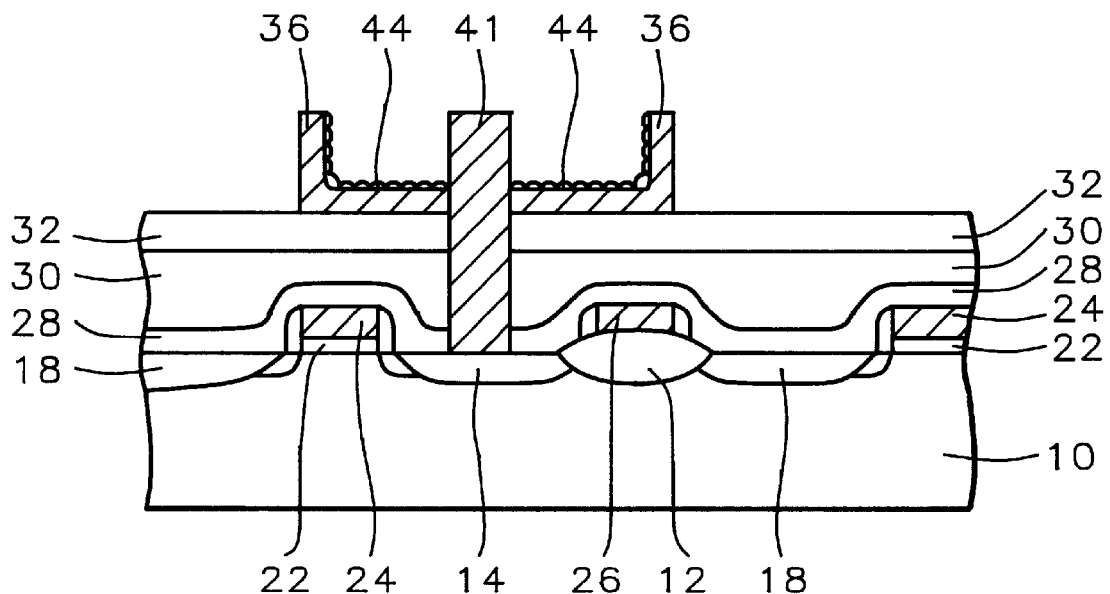
FIG. 19 is a cross section view of the integrated circuit wafer of FIG. 17 after the third dielectric and fourth dielectric have been etched away.
Figure 20:
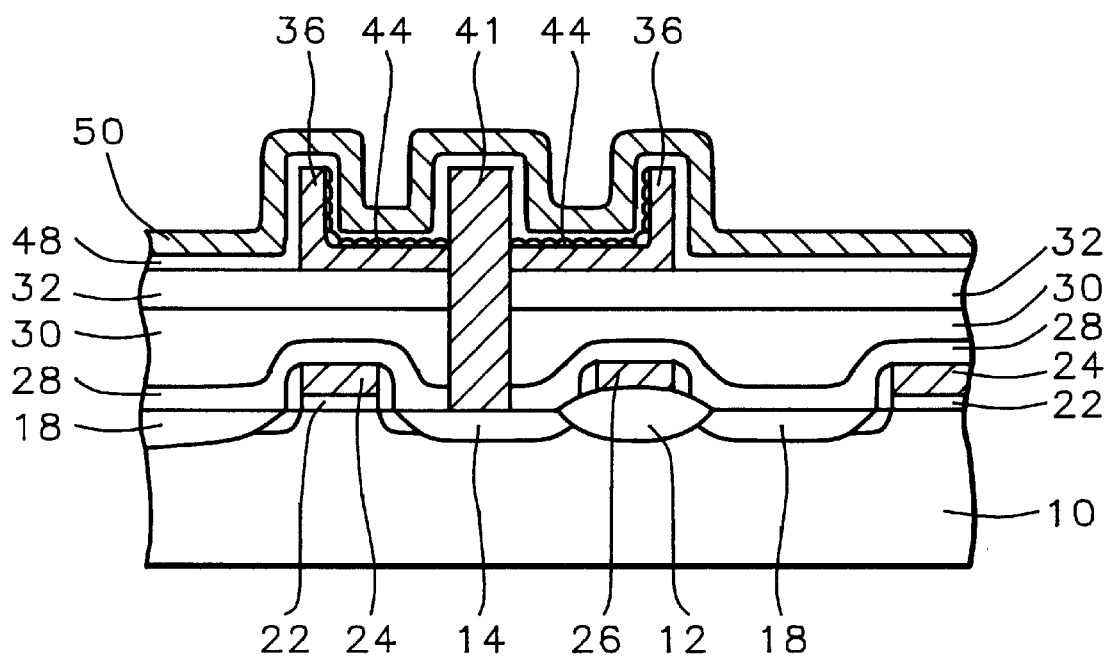
FIG. 20 is a cross section view of the integrated circuit wafer of FIG. 19 after the layer of fifth dielectric and polysilicon second capacitor plate have been deposited.

Next, as shown in FIG. 19, the remaining third dielectric and fourth dielectric are etched away completing the first capacitor plate, 46 and 41. As shown in FIG. 20, a conformal layer of fifth dielectric 48, such as NO, ONO, or $Ta_2O_5$ having a thickness of between about 55 and 300 Angstroms is then deposited covering the first capacitor plate. A layer of third conductor material 50, such as polysilicon, is then deposited over the conformal layer of fifth dielectric 48, see FIG. 20. The layer of fifth dielectric 48 and the layer of third conductor material 50 are then patterned to complete the capacitor.

While the invention has been particularly shown and described with reference to the preferred embodiments thereof, it will be understood by those skilled in the art that various changes in form and details may be made without departing from the spirit and scope of the invention.

What is claimed is:

1. A method of forming capacitors, comprising the steps of:

providing an integrated circuit wafer having devices formed therein, a number of contact regions, and a planarized layer of first dielectric formed thereon;

depositing a layer of second dielectric having capacitor regions on said planarized layer of first dielectric wherein each of said capacitor regions is directly above one of said contact regions;

depositing a layer of third dielectric having a top surface on said layer of second dielectric;

patterning said layer of third dielectric thereby forming capacitor holes, wherein each of said capacitor holes has sidewalls and a bottom, in said layer of third dielectric by means of etching away that part of said layer of third dielectric over each of said capacitor regions of said layer of second dielectric;

depositing a layer of first conductor material on said patterned layer of third dielectric thereby forming first conductor material on said top surface of said layer of first conductor material, said sidewalls of said capacitor holes, and said bottoms of said capacitor holes;

filling said capacitor holes with fourth dielectric;

forming contact holes in said fourth dielectric, said first conductor material, said third dielectric, said second dielectric, and said first dielectric thereby exposing said contact regions;

filling said contact holes with second conductor material;

etching away those parts of said first conductor material, said second conductor material, and said fourth dielectric above the plane of said top surface of said third dielectric material thereby forming a first capacitor plate from said etched first conductor material and said etched second conductor material;

etching away the remaining said third dielectric and the remaining said fourth dielectric;

depositing a conformal layer of fifth dielectric on said integrated circuit wafer thereby covering said first capacitor plate;

forming a layer of third conductor material on said conformal layer of fifth dielectric thereby forming a second capacitor plate; and patterning said layer of fifth dielectric and said layer of third conductor material.

2. The method of claim 1 wherein said layer of first dielectric is a layer of borophosphosilicate glass.

3. The method of claim 1 wherein said layer of first dielectric is a layer of silicon oxide deposited using ozone and tetra-ethyl-ortho-silicate.

4. The method of claim 1 wherein said layer of second dielectric is silicon oxynitride having a thickness of between about 60 and 200 Angstroms.

5. The method of claim 1 wherein said layer of second dielectric is silicon nitride having a thickness of between about 60 and 200 Angstroms.

6. The method of claim 1 wherein said layer of third dielectric is a layer of borophosphosilicate glass having a thickness of between about 9000 and 13,500 Angstroms.

7. The method of claim 1 wherein said layer of third dielectric is a layer of silicon oxide deposited using ozone and tetra-ethyl-ortho-silicate having a thickness of between about 9000 and 13,500 Angstroms.

8. The method of claim 1 wherein said layer of first conductor material is a layer of polysilicon having a thickness of between about 800 and 1200 Angstroms.

9. The method of claim 1 wherein said second conductor material is polysilicon.

10. The method of claim 1 wherein said fourth dielectric is borophosphosilicate glass.

11. A method of forming capacitors, comprising the steps of:

providing an integrated circuit wafer having devices formed therein, a number of contact regions, and a planarized layer of first dielectric formed thereon;

depositing a layer of second dielectric having capacitor regions on said planarized layer of first dielectric wherein each of said capacitor regions is directly above one of said contact regions;

depositing a layer of third dielectric having a top surface on said layer of second dielectric;

patterning said layer of third dielectric thereby forming capacitor holes, wherein each of said capacitor holes has sidewalls and a bottom, in said layer of third dielectric by means of etching away that part of said layer of third dielectric over each of said capacitor regions of said layer of second dielectric;

depositing a layer of polysilicon on said patterned layer of third dielectric thereby forming polysilicon on said top surface of said layer of first conductor material, said sidewalls of said capacitor holes, and said bottoms of said capacitor holes;

depositing a layer of hemispherical grain polysilicon on said layer of first conductor material;

filling said capacitor holes with fourth dielectric;

forming contact holes in said fourth dielectric, said layer of polysilicon, said layer of hemispherical grain polysilicon, said third dielectric, said second dielectric, and said first dielectric thereby exposing said contact regions;

filling said contact holes with second conductor material;

etching away those parts of said layer of polysilicon, said layer of hemispherical grain polysilicon, said second conductor material, and said fourth dielectric above the plane of said top surface of said third dielectric material thereby forming a first capacitor plate from said etched layer of polysilicon, said etched layer of hemispherical grain polysilicon, and said etched second conductor material;

etching away the remaining said third dielectric and the remaining said fourth dielectric;

depositing a conformal layer of fifth dielectric on said integrated circuit wafer thereby covering said first capacitor plate;

forming a layer of third conductor material on said conformal layer of fifth dielectric thereby forming a second capacitor plate; and patterning said layer of fifth dielectric and said layer of third conductor material.

12. The method of claim 11 wherein said layer of first dielectric is a layer of borophosphosilicate glass.

13. The method of claim 11 wherein said layer of first dielectric is a layer of silicon oxide deposited using ozone and tetra-ethyl-ortho-silicate.

14. The method of claim 11 wherein said layer of second dielectric is silicon oxynitride having a thickness of between about 60 and 200 Angstroms.

15. The method of claim 11 wherein said layer of second dielectric is silicon nitride having a thickness of between about 60 and 200 Angstroms.

16. The method of claim 11 wherein said layer of third dielectric is a layer of borophosphosilicate glass having a thickness of between about 9000 and 13,500 Angstroms.

17. The method of claim 11 wherein said layer of third dielectric is a layer of silicon oxide deposited using ozone and tetra-ethyl-ortho-silicate having a thickness of between about 9000 and 13,500 Angstroms.

18. The method of claim 11 wherein said layer of polysilicon has a thickness of between about 800 and 1200 Angstroms.

19. The method of claim 11 wherein said second conductor material is polysilicon.

20. The method of claim 11 wherein said fourth dielectric is borophosphosilicate glass.

* * * * *